(12) United States Patent
McConnell et al.

(10) Patent No.: US 9,357,634 B2
(45) Date of Patent: May 31, 2016

(54) COEFFICIENT OF THERMAL EXPANSION COMPENSATING COMPLIANT COMPONENT

(71) Applicant: KEMET Electronics Corporation, Simpsonville, SC (US)

(72) Inventors: John E. McConnell, Simpsonville, SC (US); Alan P. Webster, Simpsonville, SC (US); John Bultitude, Simpsonville, SC (US); Abhijit Gurav, Simpsonville, SC (US)

(73) Assignee: Kemet Electronics Corporation, Simpsonville, SC (US)

( * ) Notice: Subject to any disclaimer, the term of this patent is extended or adjusted under 35 U.S.C. 154(b) by 504 days.

(21) Appl. No.: 13/870,414

(22) Filed: Apr. 25, 2013

(65) Prior Publication Data

US 2013/0284501 A1    Oct. 31, 2013

Related U.S. Application Data

(60) Provisional application No. 61/639,427, filed on Apr. 27, 2012, provisional application No. 61/655,276, filed on Jun. 4, 2012.

(51) Int. Cl.
*H05K 7/04* (2006.01)
*H01L 23/49* (2006.01)
(Continued)

(52) U.S. Cl.
CPC .............. *H05K 1/0271* (2013.01); *H01C 1/014* (2013.01); *H01C 1/14* (2013.01); *H01C 7/18* (2013.01); *H01G 2/06* (2013.01); *H01G 4/232* (2013.01); *H01G 4/38* (2013.01); *H05K 3/30* (2013.01); *H05K 3/301* (2013.01); *H05K 1/181* (2013.01); *H05K 1/182* (2013.01);

(Continued)

(58) Field of Classification Search
CPC ............................. H05K 7/04; H01L 23/49544
See application file for complete search history.

(56) References Cited

U.S. PATENT DOCUMENTS 4,617,609 A    10/1986    Utner et al.
6,081,416 A     6/2000    Trinh et al.
(Continued)

FOREIGN PATENT DOCUMENTS

JP    2013-038144 A    8/2011
JP    2013-038291 A    8/2011
KR    10-2011-0104891    9/2011

OTHER PUBLICATIONS

IPEA/KR; International Preliminary Report on Patentability; PCT/US2013/038200; Applicant: Kemet Electronics Corporation: date of completion: Jul. 24, 2014.

(Continued)

*Primary Examiner* — Jeremy C Norris
(74) *Attorney, Agent, or Firm* — Joseph T. Guy; Perkins Law Firm, LLC

(57) ABSTRACT

An improved discrete electronic device and method of making the improved discrete electronic device is described. The discrete electronic device has an electronic passive component with a termination and a lead frame. A compensating compliant component is between the termination and the lead frame. The compensating compliant component has a composite core and a first conductor on the composite core. The first conductor is in electrical contact with the termination. A second conductor is also on the composite core wherein the second conductor is in electrical contact with the lead frame.

72 Claims, 11 Drawing Sheets

(51) Int. Cl.
- *H05K 1/02* (2006.01)
- *H05K 3/30* (2006.01)
- *H01G 4/38* (2006.01)
- *H01C 1/014* (2006.01)
- *H01C 1/14* (2006.01)
- *H01C 7/18* (2006.01)
- *H01G 2/06* (2006.01)
- *H01G 4/232* (2006.01)
- *H05K 1/18* (2006.01)

(52) U.S. Cl.
CPC .................. *H05K 2201/049* (2013.01); *H05K 2201/10015* (2013.01); *H05K 2201/10454* (2013.01); *Y10T 29/49121* (2015.01)

(56) References Cited

U.S. PATENT DOCUMENTS

| | | | |
|---|---|---|---|
| 6,191,933 | B1 | 2/2001 | Ishigaki et al. |
| 6,288,887 | B1 | 9/2001 | Yoshida et al. |
| 6,310,759 | B2 | 10/2001 | Ishigaki et al. |
| 6,388,864 | B1 | 5/2002 | Nakagawa et al. |
| 6,515,844 | B1 | 2/2003 | Moriwaki et al. |
| 8,472,161 | B2 | 6/2013 | Nishimura et al. |
| 2001/0048591 | A1 | 12/2001 | Fjelstad et al. |
| 2005/0116322 | A1* | 6/2005 | Sando et al. .................. 257/676 |
| 2007/0080713 | A1 | 4/2007 | Umbach |
| 2007/0188975 | A1 | 8/2007 | Togashi et al. |
| 2007/0211414 | A1 | 9/2007 | Pelcak et al. |
| 2008/0019081 | A1 | 1/2008 | Kim et al. |
| 2008/0247122 | A1 | 10/2008 | Vaisman et al. |
| 2008/0291606 | A1 | 11/2008 | Takahashi et al. |
| 2009/0034155 | A1 | 2/2009 | Devoe |
| 2009/0116173 | A1 | 5/2009 | Shimizu et al. |
| 2010/0177490 | A1* | 7/2010 | Gibbons et al. ............... 361/764 |
| 2010/0226071 | A1 | 9/2010 | Ibata et al. |
| 2010/0243307 | A1 | 9/2010 | McConnell et al. |
| 2011/0205687 | A1 | 8/2011 | Inoue et al. |
| 2013/0020665 | A1* | 1/2013 | Oganesian ..................... 257/432 |

OTHER PUBLICATIONS

Korean Intellectual Property Office; International Search Report and Written Opinion; PCT/US2013/038200; Applicant: Kemet Electronics Corporation: Aug. 14, 2013.

* cited by examiner

COEFFICIENT OF THERMAL EXPANSION COMPENSATING COMPLIANT COMPONENT

CROSS-REFERENCE TO RELATED APPLICATIONS

The present application claims priority to U.S. Provisional Patent Application No. 61/639,427 filed Apr. 27, 2012 and to U.S. Provisional Patent Application No. 61/655,276 filed Jun. 4, 2012 both of which are incorporated herein by reference.

DETAILED DESCRIPTION

All products are developed to meet performance specifications that define how a product is to perform functionally and under various operating and environmental conditions. Specifications apply not only to the end product but to the sub-assemblies and even individual components that make up the end product. The reliability of a product is only as reliable as the weakest link in the system and depends on how well the subsystems, components, and materials interact with one another in a predictable and consistent manner. Ensuring adequate performance, requires the consideration and application of several mechanical and physical properties of the materials being considered and selected for use in the application. This practice applies to all designs and applications while some applications may be more critical than others.

One important material property is the Coefficient of Thermal Expansion (CTE). CTE is the rate at which a material expands or contracts with respect to a change in temperature. CTE made its importance known during the infancy of the semi-conductor industry with the introduction of the transistor. Early failures were attributed to the mounting of the silicon based transistor to a metal base. After the assembly experienced a few temperature cycles, the transistor would separate from the base causing a failure. The failure was attributed to stress fractures induced into the transistor as a result of temperature cycles and was determined to be caused by the CTE mismatch between the metal base, to which the transistor was mounted, and the CTE of the silicon based transistor. As seen from Table 1, Silicon has a CTE of 1.38-2.31 and copper has a CTE of 9.11-13.8. The copper expands or contracts a rate of about nine times the rate of silicon. This problem provides the incentive to develop new materials to better address the CTE mismatch issues.

As the semi-conductor industry developed and the electronics industry grew, a variety of materials were used to address the ever growing demand for higher performance in smaller spaces. These demands drove the need for higher performing components as well as materials to provide higher performance capabilities. With the greater mix of materials and performance drivers, material properties became ever so increasingly important. In some cases, a material had to be selected for one set of properties while another material had to be used to meet other criteria and then when it came to their respective CTE's they were totally incompatible. These situations created a conflict of materials that required a special design solution. A good example is the use of silicon and various types of ceramics which have relatively low CTE's but at some point in time have to interface with metals, having relatively high CTE's. The metals provide the high electrical conductivity needed to connect components made from silicon and or ceramic to the electrical world of the electronic product.

Table 1 lists several of the materials typically used in electronics along with their respective CTE's. A 1:1 ratio of CTE is preferred and is some cases less than a 1:1 match can have some advantages. As the mismatch between materials increases beyond 1:1, the potential for stress fractures, either in the joint or in the weakest materials, increases. A severe example would be trying to bond silica, having a CTE of about 0.417, to aluminum having a CTE of about 14. As a result of the CTE mismatch aluminum expands over 30 times more than the silica. In this case the material selected to bond the glass to the aluminum has to be very compliant with excellent adhesion properties such as a silicone based RTV having a very soft/rubbery nature allowing the aluminum to expand and contract freely while maintaining a strong bond line between the glass and the aluminum without the tendency to experience cohesive failures itself.

TABLE 1

| | Materials as Published in Matweb.com | | | | | | | | | | |
|---|---|---|---|---|---|---|---|---|---|---|---|
| Coeffiecient of Thermal Expansion CTE | Silica | Alumina Al$_2$O$_3$ | Silicon | Aluminum | Copper | Phosphor Bronze | Alloy 42 | Kovar | Invar | G10 | *See Note BaTiO3 |
| Micro Inches/Inch ° F. | 0.417 | 3.5-4.44 | 1.38-2.31 | 13.3-15.2 | 9.11-13.8 | 9.89 | 2.5-3.61 | 2.83-3.06 | .722-4.22 | 5.5 | |
| Temperature Range ° F. | 32-572 | 68-1830 | 77-981 | 68-572 | 68-1700 | 68-572 | 68-572 | 68-842 | 199-700 | 68 | |
| Microns/Meter ° C. | 0.75 | 6.3-8.0 | 2.94-4.44 | 24-27.4 | 16.4-24.8 | 17.8 | 4.5-6.5 | 5.1-5.5 | 1.3-7.6 | 9.9 | 10 |
| Temperature Range ° C. | 0-300 | 20-1000 | 25-1027 | 20-500 | 20-925 | 20-300 | 20-300 | 20-450 | 93-371 | 20 | 25-125 |

*Reference Pat. No. 6,081,416 Jun. 27, 2000

To emphasize the importance of CTE, and the need for new materials to better serve these new material demands, the industry developed iron based alloys typically referred to as Alloy 42, Kovar, and Invar to better match the CTE's of Silicon and ceramics such as alumina. Conductive epoxies were also developed to provide a more flexible joint between the silicon based devices and the metal lead frames or bases to which they are attached. Other attachment technologies that are used include Au/Sn, Au/Si, Au/Ge eutectic bonding as well as Sn/Pb solders. However, these joining materials and technologies formed more rigid joints making CTE mismatches much more critical and their use very specific to the application.

As the demand for greater product performance increases and final package sizes get smaller, demands on component size with greater performance continually challenges engineers to develop creative designs to meet these demands. Discrete components with leads, known in the industry as thru-hole technology, gave way to surface mount technology which are components with no leads. This technology enabled the components to get smaller and to consume less surface area on the circuit board but also create a new wave of engineering and design problems as well as issues associated with high volume automated assembly. The new demands of electronics places new requirements on passive components such as capacitors, and specifically a Multilayer Ceramic Capacitor (MLCC). MLCC technology provides the means to get higher capacitance out of a smaller unit of volume thereby meeting the demands of increased component density needed to meet increasing product performance requirements. The one common component of electronic modules is the circuit board to which virtually all of the electronic components are assembled. The circuit boards are typically fabricated from one of a group of 4 material types, epoxy-glass composites, ceramic, aluminum, and polyimide films. Each material has its own set of issues that have to be dealt with when selecting one of these materials for use in a particular application. Epoxy-glass composites generally known in the industry as FR4 or G10 are somewhat flexible and can cause ceramic based components to fracture due to the flexing of the circuit board material. Substrates made from ceramic are typically very rigid but are susceptible to thermal shocks. Aluminum is also used in a circuit board application and referred to as Insulated Metal Substrates (IMS). IMS technology is typically used in applications that require high thermal dissipation but IMS's have a high CTE as shown in Table 1. While IMS is good for high thermal dissipation applications, CTE mismatches between the IMS and the components mounted to the IMS becomes even more critical. High rates of thermal expansion can cause severe CTE mismatches with components having low CTE's which can lead to fractured components. Polyimide films known as Kapton are used for "flex circuits". These are basically circuit boards constructed on films of only a few thousandth's of an inch thick, making them very flexible, meaning they can have bend radii as low as approximately 3.175 mm (0.125 inches), depending on the design.

Components must be able to withstand circuit board flexing, CTE mismatches, bending and or twisting. To compound the problem, designers are being forced to increase the functionality of their electronic modules/products and do so in a smaller space, often referred to as increasing the volumetric efficiency. These demands can be met by several techniques such as increasing the volumetric efficiency of the components to achieve higher capacity from a smaller space; reducing component count by up-integrating of discrete components into the microprocessors or by relaxing the product performance requirements which is generally unacceptable. In some cases it may not be practicable to increase the volumetric efficiency of a component beyond its current design and other solutions have to be considered.

In the case of passive electronic components such as resistors, inductors, and or capacitors, and MLCCs specifically, stacking two or more MLCC's having the same value and physical size on top of one another is one way to increase the capacitance within the space defined by the respective pad area for the component without increasing its surface area footprint. In the case with the MLCC, the capacitance of the stack of components is determined by multiplying the capacitance of one MLCC by the number of MLCC's in the stack. Thus providing for many capacitors which provides for higher capacitance occupying the same surface area as one MLCC. While the stacking of multiple same type components increases the volumetric efficiency, other design and assembly issues have to be taken into consideration.

The mechanical integrity of the stack has to be maintained through all of the assembly processes and the life of the product. Electrical and mechanical contact has to be made with the terminations of the MLCC's and maintained during the life of the product. The final design also has to be compatible with industry accepted assembly methods, practices, and materials. To achieve all of these goals, lead frame technology developed for the semiconductor industry was borrowed and applied to single MLCC's and or stacks having 2 or more MLCC's. The metal lead frames made from copper, phosphor bronze, brass known as non-ferrous materials and the Iron based alloys of Alloy 42, Kovar, and invar known as ferrous alloys, were used to provide the mechanical and electrical connections between the MLCC's and the respective circuit board.

MLCC's typical utilize either lead frames having multiple pins wherein the pins are inserted into holes formed in the circuit board, referred to as Thru-Hole Technology, or they use surface mount lead frames having a formed solder foot connected to the terminations of the capacitor using solder technology and materials. The significant difference is that surface mount technology eliminates the need for the thru-holes required for lead frames with pins, thus enabling much higher component densities to be achieved.

Both thru-hole technology and surface mount connection provide the electrical conductivity between the circuit board and the MLCC as well as mechanically maintaining the assembled integrity of the stack. The connection technology used to connect the lead frame to the terminations of the MLCC in this case is solder. However, other technologies that are compatible with the lead frame materials, their surface finishes, and the materials used on the MLCC's terminations can be considered. These alternative technologies may include but are not limited to, conductive adhesives, various types of soldering and brazing materials, laser soldering, laser welding, spot welding, and thermo-compression bonding just to name a few. Typically, the materials have to be specifically selected for use with each of the various interconnect technologies chosen for use. To ensure a stable and robust lead design, the lead frame material thickness will range from a typical 1 mm (0.039 inches) thick up to 0.254 mm (0.010 inches) and depending on the application may be as thick as 0.63 mm (0.025 inches). Greater lead frame material thicknesses may be used and is generally selected based on the size and mass of the device to which it is attached as well as the associated application and processes. Adding lead frames to the MLCC's or to a quantity of stacked MLCC's also introduces new design challenges that have to be overcome. The most significant is developing a lead design that provides for a high degree of flexing to accommodate the potential flexing or bending of a pliable substrate such as FR4 or the CTE mismatches encountered when the MLCC stacks are mounted to an Insulated Metal Substrate (IMS). The CTE mismatch between the ceramic body of the MLCC and that of the lead frame also has to be considered. The CTE mismatch can be an issue that causes micro fractures within the body of the MLCC which then leads to premature failures of the component.

U.S. Pat. No. 6,081,416, which is incorporated herein by reference, teaches that lead frames made from the iron based alloys or ferrous alloys, known to the industry as Alloy 42, Kovar, and Invar, are best suited to match the CTE properties of ceramic with Alloy 42 being the most commonly used. However, lead frames made from the family of non-ferrous materials offer performance advantages over their ferrous alloy counterparts. These materials offer higher electrical performance and are generally less costly than the iron based lead frames but are not well suited for matching the CTE properties of ceramic, thus creating a conflict between electrical performance and mechanical reliability.

US Patent Publ. No. 2010/0243307 titled "Leaded Multi-Layer Ceramic Capacitor with Low ESL and ESR" which is incorporated herein by reference, describes a design solution that has excellent electrical performance, but still lacks the optimal solution to solving both the CTE mismatch and providing excellent electrical properties.

Several approaches have been developed to minimize the effects of the CTE mismatches that exist between the lead frames and the MLCC. U.S. Pat. No. 3,946,290 which is incorporated herein by reference, describes a method to encapsulate the terminations and the body of the condenser with a non-conductive resin.

U.S. Pat. No. 6,310,759, which is incorporated herein by reference, demonstrates a folded lead frame for use with a materials having a CTE<13 PPM/° C. The fold provides a mechanical stress relief allowing the lead to move freely as the substrate changes with respect to the MLCC.

U.S. Pat. No. 6,288,887, which is incorporated herein by reference, focuses on the free lead frame length from the boards' surface to the bottom of the MLCC Stack. This free length also provides a mechanical stress relief that allows the lead to flex thereby allowing it to absorb the movement due to the CTE difference between the circuit board and the MLCC leaded stack.

U.S. Pat. No. 6,191,933, which is incorporated herein by reference, demonstrates a folded lead frame with the outer lead having a hole in its center which also serves as a mechanical stress relief.

U.S. Pat. No. 6,388,864, which is incorporated herein by reference, incorporates a conductive resin as a termination material which is later plated with metal suitable for soldering. The conductive resin acts as a compliant member of the joint, thus absorbing the CTE mismatch between the lead frame and the MLCC. U.S. Pat. No. 6,515,844, to Murata, which is incorporated herein by reference, utilizes solder or epoxy to attach a lead frame with a plurality of parallel slits perpendicular with the surface mount solder foot which also provide a mechanically compliant joint to absorb the CTE mismatches.

U.S. Pat. No. 6,940,708, which is incorporated herein by reference, focuses on the placement of the solder with respect to bottom of the MLCC between the MLCC and the lead frame. However, there is a limit on the distance from the bottom of the termination to the solder. The solder coverage of the termination area needs to be sufficient to provide for adequate mechanical strength. If there is no solder or adhesive connecting the termination to the lead frame then that particular junction will not be secured within the stack.

U.S. Pat. No. 6,518,632, which is incorporated herein by reference, describes the width of the lead frame tab that solders to the MLCC Stack terminations and the width of the internal electrodes is critical, and stating that the width of the lead frame tab needs to be less than the width of internal electrodes.

U.S. Pat. No. 6,958,899, which is incorporated herein by reference, teaches the critical relationship between the width of the termination, the height of the component, and the width of the lead frame connecting to the termination.

Resin based substrates have been used to from electrolytic capacitors. Exemplary references include US Publ. Appl. No. 2010/0226071; US Publ. Appl. No 2009/0116173; U.S. Publ. Appl. No. 2008/0291606; US Published Appl. No. 2008/0247122; U.S. Published Appl. No. 2008/0019081; U.S. Published Appl. No. 2007/0211414; U.S. Pat. No. 7,312,979; U.S. Pat. No. 6,819,546; and U.S. Pat. No. 6,516,513 each of which is incorporated herein by reference.

Resin based interposers serving as interconnects between high I/O packages such as ball grid arrays, chip scale packages and flip chips are taught as providing a solution to CTE mis-matches between the semiconductor package and the board and typically consisting of an array of interconnects packages. Exemplary references include US Pat. Publ. No. 2011/0080713; U.S Pat. Publ. No. 2001/0048591; U.S. Pat. No. 7,781,883; U.S. Pat. No. 6,770,981; U.S. Pat. No. 6,710,456; U.S. Pat. No. 6,573,609; U.S. Pat. No. 6,444,921; U.S. Pat. No. 6,399,892 and U.S. Pat. No. 6,332,782 each of which is incorporated herein by reference.

The large body of work illustrates the need and efforts that have taken place to address the CTE mismatch between the component, the lead frame, and the substrate to which the component is mounted. Whether it is modifying the termination metallurgy, lead frame material, or the design and shape of the lead frame, or a combination of any of these three items.

In spite of the extensive effort directed to minimizing, or structurally accommodating, CTE mismatch there is still a need for a solution to mitigate the incompatibility of materials having different CTE's while offering a solution to meet performance requirements.

Another important issue that components have to be able to withstand is the flexing of the substrate. Board flexure is generally addressed in the design of the lead. Typically, the industry refers to such design details as stress reliefs. Stress reliefs can be accomplished by selectively reducing the cross section of a lead in a predetermined location, adding a bend or multiple bends in place of having just a straight mechanical member, or increasing the free length of a lead to its attachment point. These features allow the leads to bend or flex at a lower force thus reducing the amount of stress passed on to the joint or component.

A more subtle issue, and one that is very application specific, deals with a condition created by electrostriction, often referred to as the piezoelectric effect that occurs with specific materials used in the ceramic body of the MLCC. The piezoelectric effect occurs when an electric field is applied and causes the body of the MLCC to expand and contract at a high frequency. The magnitude of this effect depends on the coupling between the ceramic used in the capacitor and the electrical field. High degrees of coupling occur with ferroelectric ceramic materials, such as those based on barium titanate, typically sued in MLCC for their high dielectric constants. The high frequency vibrations are transferred directly into the substrate to which the MLCC is mounted which in turn amplifies the sound that can cause an audible buzz. In some cases this is not a problem, but with a lap top computer, cell phone, or hearing aid, this microphonic noise is not acceptable. Furthermore the same effect can result in higher frequency electrical noise in circuits beyond the range of human hearing. This can interfere with circuit functions particularly for demanding applications such as filters for sensors. The electrostrictive coupling occurs in an axis that is perpendicular to the plane of the internal electrodes while a marginal amount of energy is transmitted along the axis parallel to the plane of the internal electrodes. Various lead frame designs, as well as different MLCC termination materials, have been developed to address the micro-phonics condition and reduce higher frequency noise. The ultimate design goal is to disassociate the MLCC from the circuit board or substrate to which it is mounted, by designing a lead frame in such a manner that the vibration created by the MLCC is absorbed by the lead frame itself which in turn dampens or nullifies the piezoelectric effect of the MLCC.

U.S. Published Patent Application No US 20070188975, which is incorporated herein by reference, demonstrates different lead frame designs focused on minimizing the piezoelectric effect of MLCC's by disassociating the MLCC from the circuit board as well as mounting the MLCC in such an orientation that the plane of the inner electrodes are perpendicular to the surface of the substrate instead of horizontal and parallel to the surface of the substrate.

U.S. Pat. No. 6,958,899, which is incorporated herein by reference, illustrates the use of an "L" formed lead with one each attached to each termination making contact on a common side of the MLCC and extending downward and beneath the MLCC in such a way to lift the MLCC off the surface of the circuit board. This design allows the leads to absorb much of the piezoelectric energy created by the MLCC.

U.S. Pat. No. 7,633,739, which is incorporated herein by reference, Illustrates a method of attaching the MLCC to the substrate in a manner such that their electrode plates are non-parallel to the surface of the substrate. This design attaches the flat side of the lead frame to the circuit board solder pad leaving no free length of the lead frame to absorb the piezoelectric energy of the MLCC. As discussed, the design issues of mounting components to circuit boards or substrates has to take into account several different physical properties of all the materials involved.

In spite of all of the efforts there is still a desire for a method for attaching MLCC's, or other passive components, to a lead wherein the combination is capable of being subjected to changes in temperature without detriment.

SUMMARY

It is an object of the invention to provide an improved electronic component.

It is a particular object of the invention to provide an improved electronic component which is capable of being subjected to variations in temperature without detriment.

It is another object of the invention to provide an improved electronic component which is less susceptible to microphonics and high frequency noise when placed in an electrical circuit.

These and other advantages, as will be realized, are provided in a discrete electronic device. The discrete electronic device has an electronic passive component with a termination and a lead frame. A compensating compliant component is between the termination and the lead frame. The compensating compliant component has a composite core and a first conductor on the composite core. The first conductor is in electrical contact with the termination. A second conductor is also on the composite core wherein the second conductor is in electrical contact with the lead frame.

Yet another embodiment is provided in a method of forming a discrete electronic device comprising:
providing at least one electronic passive component comprising a termination; providing a lead;
attaching the termination of the electronic passive component to a first conductor of a compensating compliant component; and
attaching the lead to a second conductor of the compensating compliant component wherein the compensating compliant component comprises a composite core with the first conductor and the second conductor on the composite core.

Yet another embodiment is provided in a discrete electronic device. The discrete electronic device comprises an electronic passive component with a termination, a lead frame and a compensating compliant component. The compensating compliant component has a composite core and a first conductor on the composite core wherein the first conductor is in electrical contact with the termination. A second conductor is on the composite core wherein the second conductor is in electrical contact with the lead frame.

DETAILED DESCRIPTION

The present invention is directed to a novel design that addresses the CTE mismatch between the lead frame and the MLCC, provides stress relief to compensate for board flexure, and design flexibility to address the subtle issues of microphonics. More specifically, the present invention is directed to a Compensating Compliant Component (C3) comprising an inner core made from a composite of glass fibers and epoxy resins with electrical traces on either side thereof wherein the electrical traces are in electrical contact with each other by vias. The C3 is then used to connect a lead to a passive electronic component, preferably an MLCC, and the C3 absorbs any thermal expansion mismatches between the components connected thereto.

The C3 provides a compliant component that will absorb the CTE mismatch between the metal lead frame and the MLCC while providing high electrical performance properties as compared to an Alloy 42 or other Iron based alloy lead frames. By placing the C3 component between the lead and the component's termination, the C3 acts as a buffer and absorbs the differences in the CTE values of the component and the lead frame.

The invention will be described with reference to the figures without limit thereto. The figures are provided to facilitate an understanding of the invention and are not intended to limit the invention. Throughout the description similar elements will be numbered according.

Figure 1:
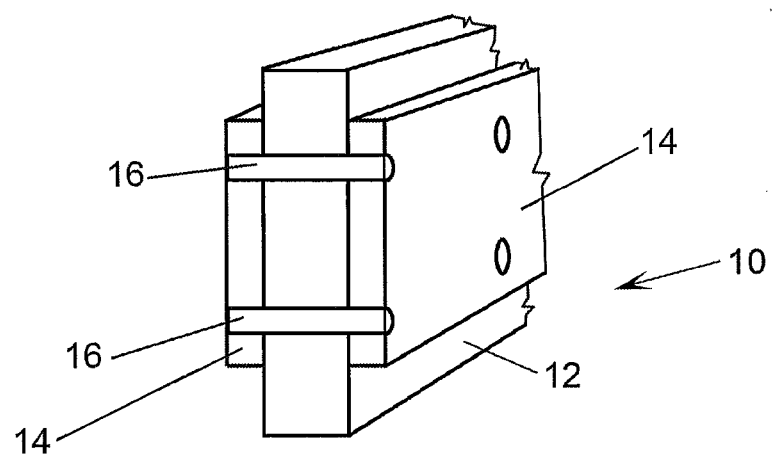
FIG. 1 is a perspective partial schematic view of an embodiment of the invention.

An embodiment of the invention is illustrated in side perspective schematic view in FIG. 1. In FIG. 1 a compensating compliant component (C3) is represented in perspective cross-sectional view of 10. The C3 comprises a composite core, 12, with conductors, 14, on either side thereof. The conductors on either side of the composite core are electrically connected by thru-hole plating, 16, which extends through the composite core as will be further explained herein. A C3 is placed between two elements, such as a lead frame and terminations of the MLCC stack, as will be further described. The C3 minimizes the effects of CTE mismatch between a lead frame and the MLCC and the flexing of a substrate to which the component is attached.

Figure 2:
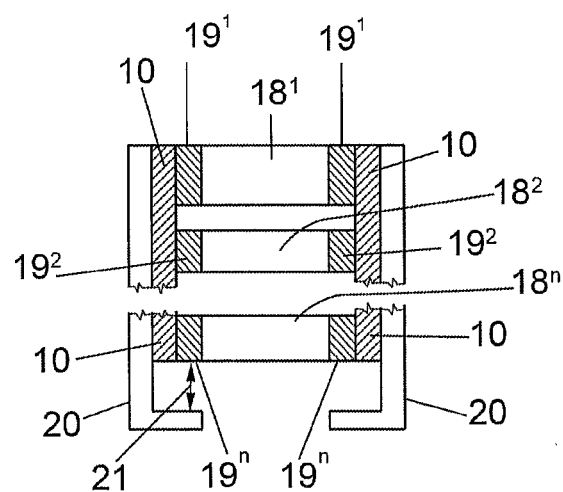
FIG. 2 is a side perspective view of an embodiment of the invention.

A stacked capacitor is illustrated in FIG. 2 wherein a multiplicity of electronic passive components $18^1$-$18^n$, represented as multi-layered ceramic capacitors (MLCC), are between lead frames, 20. Each capacitor has an external termination, 19. The C3 is mounted between the lead frame and the external terminations of the capacitor thereby providing protection against CTE mismatched between the lead frame and external termination. The number of electronic passive components can be very large with 1 up to 100 being suitable for demonstration of the invention. The stacked capacitor of FIG. 2 represents a discrete electronic component with each passive electronic device, represented as MLCC's, attached to the lead frame with only a C3, 10, there between and adhesive layers as necessary and having a single functionality.

Figure 3:
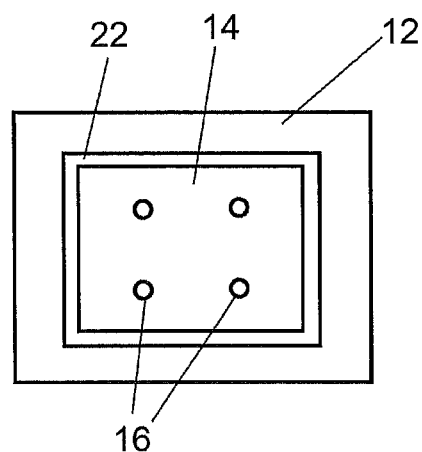
FIG. 3 is a front schematic view of an embodiment of the invention.
Figure 4A:
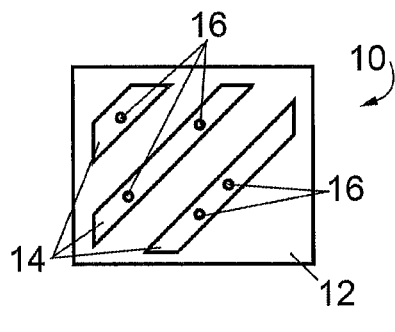
FIGS. 4A-4D are front schematic views of an embodiment of the invention.
Figure 4B:
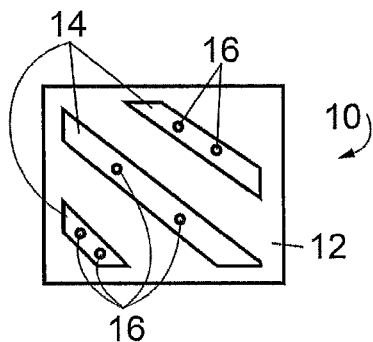
Figure 4C:
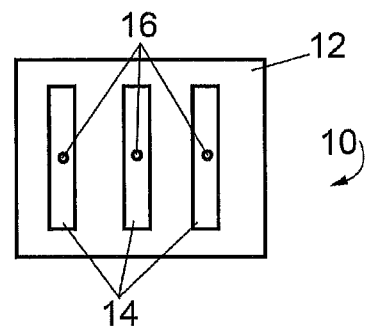
Figure 4D:
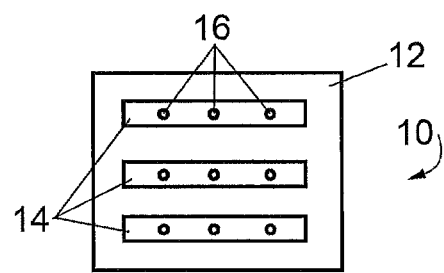

Solder masks can be utilized to cover the entire solderable surfaces and by various selective removal processes, then create small and well defined openings in the solder mask to expose the solder pad surface. These selectively defined and strategically located openings correspond to mating locations on the capacitors' termination. An embodiment of the C3 is illustrated in front schematic view in FIG. 3. In FIG. 3, the composite core, 12, and conductor, 14 are as illustrated above. A solder mask, 22, forms barriers for solder migration beyond a defined area, preferably beyond the area of the conductor. As will be realized from further discussion the solder mask minimizes solder migration into undesirable areas during subsequent assembly. An optional solder mask on the C3 can be used to limit the solders' wetting distance thereby providing the flexibility to design custom and strategically located solder joints defined by the design of the C3 solder pads. The solder mask provides another design advantage in that it provides the designer better control of the joint thickness. The joint thickness will vary as the thickness of solder mask varies. The thickness of the solder mask controls the joint thickness. The thicker the solder mask the thicker the joint can be without breaching the boundary formed by the mask. A thicker joint will absorb greater stress caused by CTE mismatches.

The C3 termination pads can be custom designed to position the solder joints to preferred areas of the termination. Various conductor configurations are illustrated in FIGS. 4A-4D wherein configurations other than a single continuous element over the area of attachment, as illustrated in FIGS. 1 and 3, as discrete conductive pads with any number of pads. Each pad may be in electrical contact with at least one conductive pad on the opposite side as described elsewhere herein. Each component may be attached to a discrete conductive pad in exclusive fashion such that each conductive pad is in contact with only one component which is attached to the C3. Alternatively, a conductive pad may be in contact with multiple components which are attached to the C3. The specific solder pad can be formed by printing techniques thus eliminating the need for a masking process or by a subtractive process to remove or etch the conductor, such as a copper foil, from unwanted areas. The conductive pads may be the same shape and size on each side of the support, defined herein as symmetrical, or they may be a different size and/or shape which is defined herein as asymmetrical.

Figure 5:
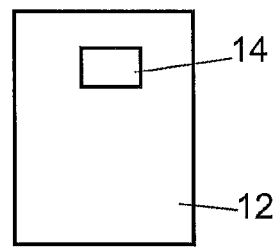
FIG. 5 is a front schematic view of an embodiment of the invention.
Figure 6:
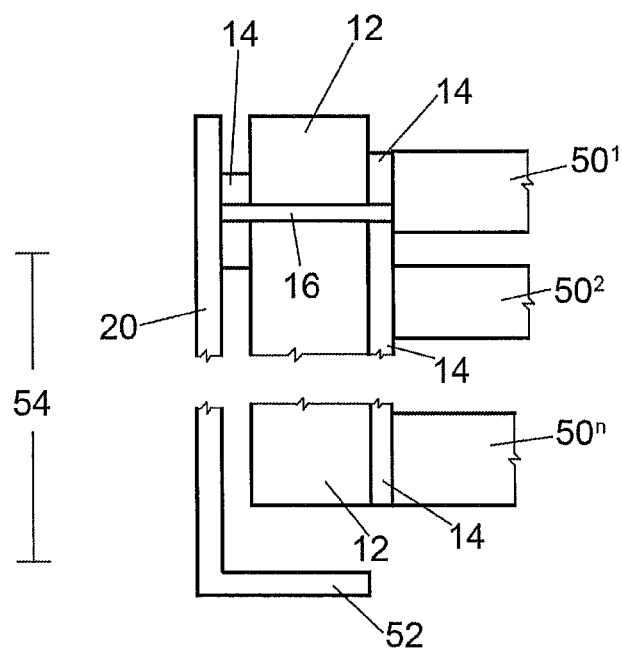
FIG. 6 is a side perspective partial schematic view of an embodiment of the invention.

An embodiment of the invention will be described with reference to FIGS. 5 and 6. The component side of a C3 is illustrated in front view in FIG. 5 with a partial conductor, 14, thereon. As would be realized the partial conductor covers a small area of the composite core, 12, and therefore forms an electrical connection at less than the full available bonding area. In FIG. 6, electrical components, 50, are in electrical contact with a conductor, 14, on one side of the composite core, 12, and the lead, 20, is in electrical contact with the partial conductor at the upper extent, opposite the foot, 52, of the lead. The lower most electrical component, $50^n$, is a distance, 21, above the foot as shown in FIG. 2. By attaching the lead at the upper extent a moment arm, 54, which is the unattached portion of the lead between the partial conductor and the foot, provides for the assembly to flex thereby minimizing the impact of CTE mismatches, vibrations and board flexure. A distinct advantage is provided by maximizing the length of the bending moment of the lead.

Figure 7:
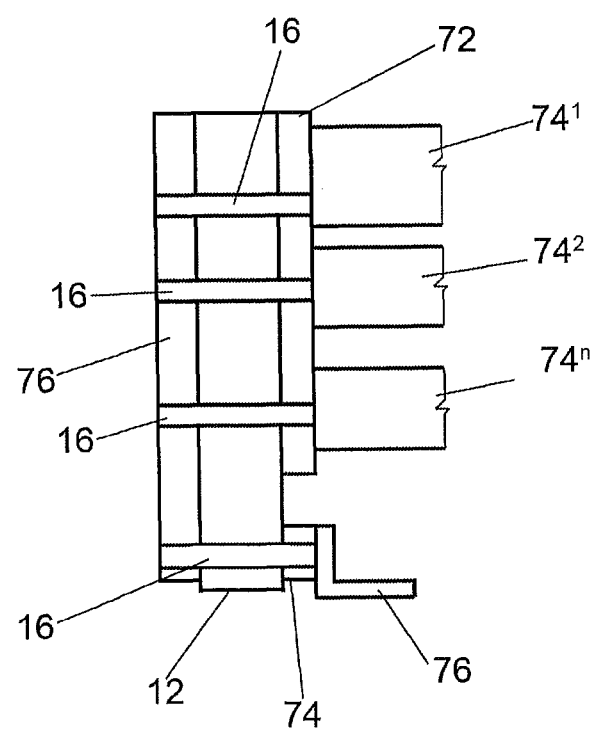
FIG. 7 is a side perspective partial schematic view of an embodiment of the invention.

An embodiment of the invention is illustrated in partial cut-away cross-sectional view in FIG. 7. In FIG. 7, a composite core, 12, comprises a component conductor, 72, and a lead conductor, 74, on a common face. The component conductor and lead conductor are in electrical contact with a connecting conductor, 76, by thru-hole plating, 16. Component, 74, such as MLCC's are in electrical contact with the component conductor, 72, and a lead, 76, is in electrical contact with the lead conductor, 74. The embodiment of FIG. 7 allows for further miniaturization of the ultimate component.

Figure 8:
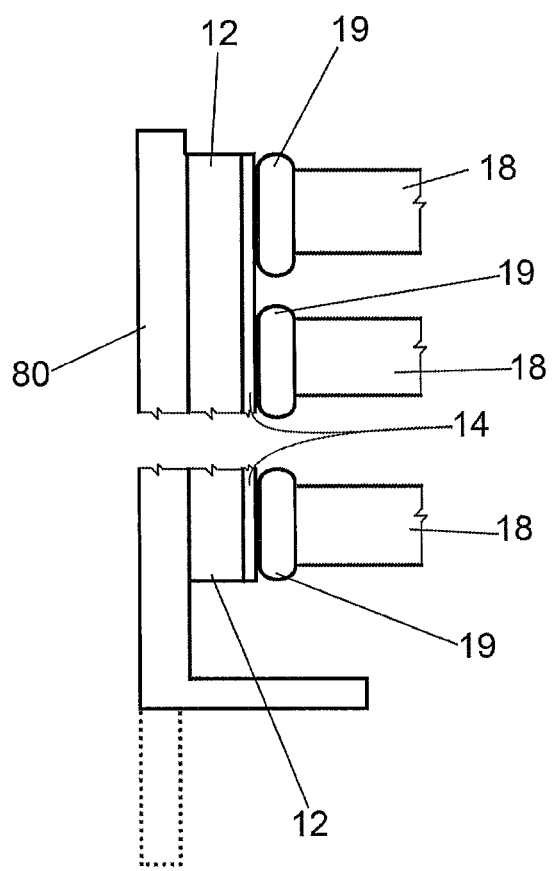
FIG. 8 is a side perspective partial schematic view of an embodiment of the invention.

An embodiment of the invention is illustrated in partial cross-sectional view in FIG. 8. In FIG. 8 the composite core, 12, and conductor, 14, and MLCC, 18, are as described elsewhere herein. The lead frame, 80, opposite to the components, MLCC's in this instance, extends beyond the composite core and functions as the lead by either being bent to form a foot, as illustrated in solid lines, for mounting to a circuit trace on the surface of a circuit board, or the conductor may have pins, as illustrated in broken line, for inserting into holes of a circuit board both of which are well known and commonly practiced.

Figure 9:
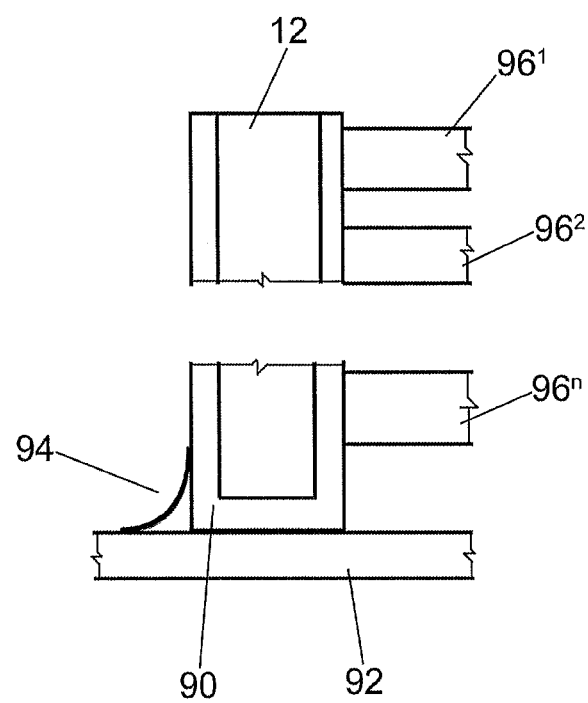
FIG. 9 is a side perspective partial schematic view of an embodiment of the invention.

An embodiment of the invention is illustrated in partial cross-sectional view in FIG. 9. In FIG. 9, the conductor, 90, wraps at least partially around the composite core, 12, such that the conductor is on at least two faces of the composite core thereby allowing for attaching to a circuit trace, 92, by solder, 94, preferably opposite the components, 96.

Figure 10:
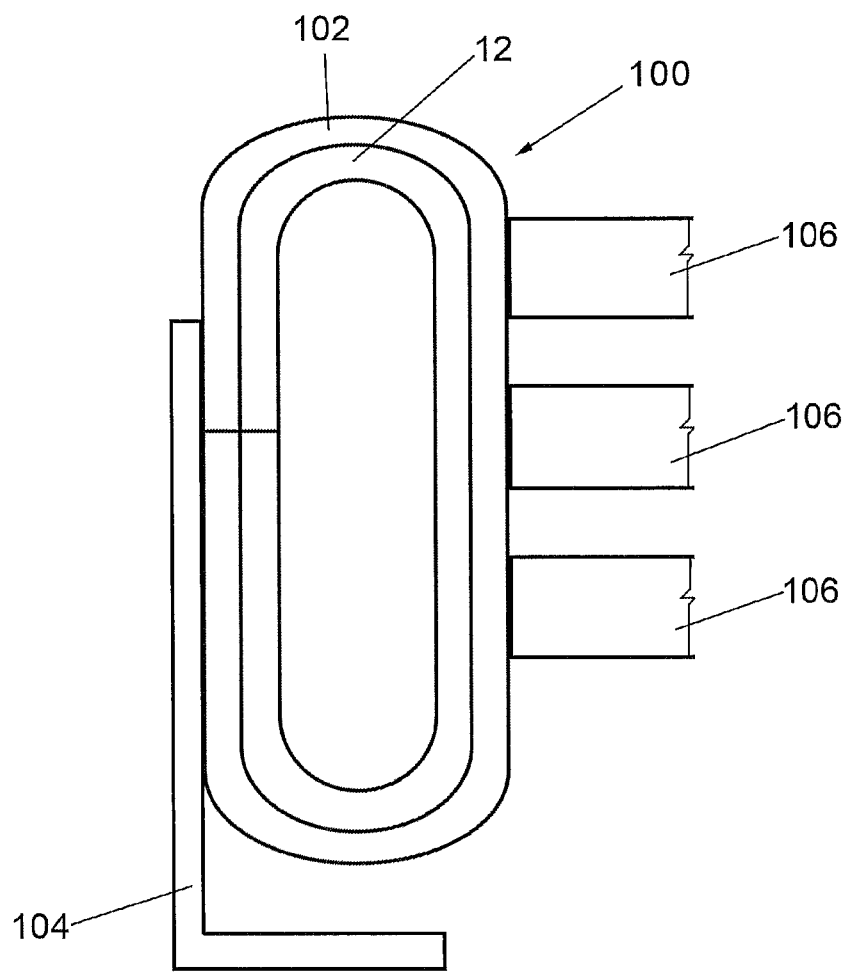
FIG. 10 is a side perspective partial schematic view of an embodiment of the invention.

An embodiment of the invention is illustrated in partial side view in FIG. 10. In FIG. 10, the C3, 100, comprises a composite core, 12, with a continuous conductor, 102, on one surface. The C3 is formed into a loop with the lead, 104, and components, 106, in electrical contact with the same conductor. The loop provides a flexible connection thereby minimizing the impact of CTE mismatches.

Figure 11:
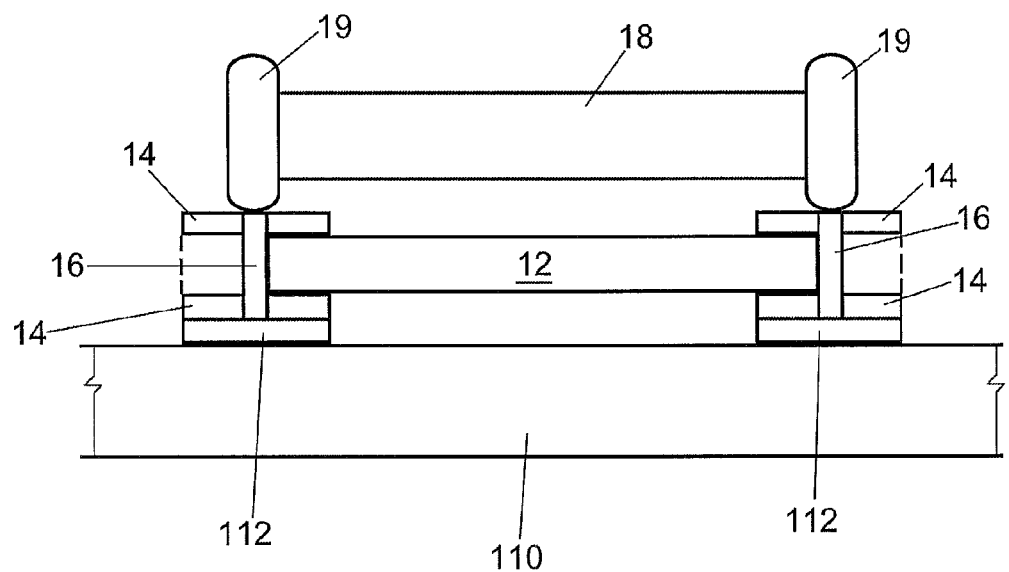
FIG. 11 is a side perspective partial schematic view of an embodiment of the invention.

An embodiment of the invention is illustrated in side perspective schematic view in FIG. 11. In FIG. 11, an MLCC, 18, with terminations, 19, is mounted to traces, 112, of a circuit board, 110, through a C3 comprising a composite core, 12, conductors, 14, on either side thereof and thru-hole plating, 16, connecting conductors on either side of the composite core. The C3 is mounted parallel to the circuit board. The parallel mounting of the C3 mitigates the impact of CTE mismatches and dampens buzzing which occurs due to piezoelectric induced micro-phonics.

Figure 12:
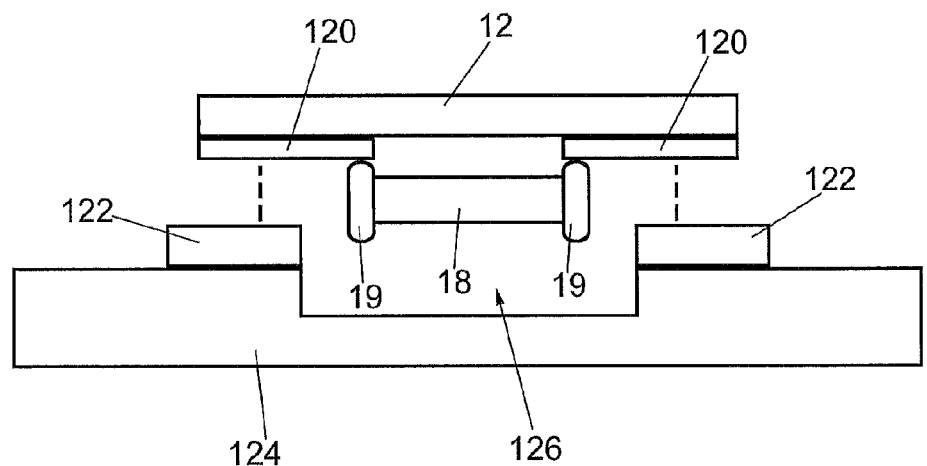
FIG. 12 is a side perspective partial exploded schematic view of an embodiment of the invention.
Figure 13:
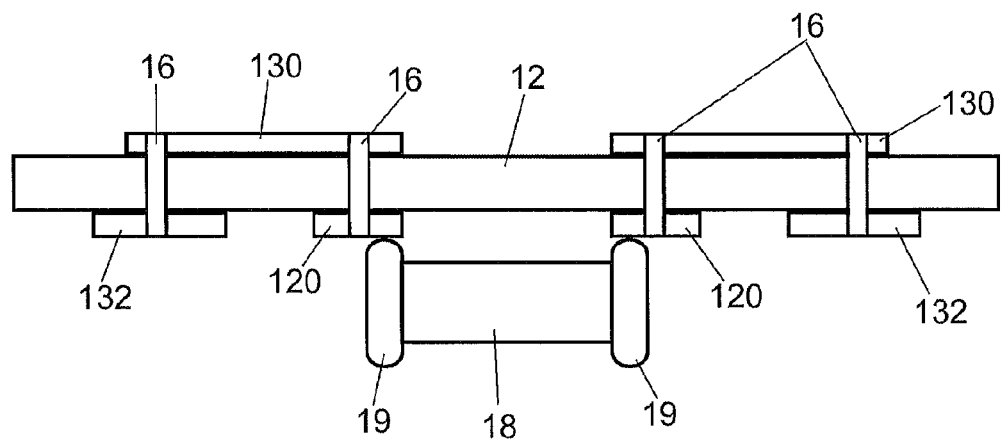
FIG. 13 is a side perspective partial schematic view of an embodiment of the invention.

An embodiment of the invention is illustrated in side, partially exploded, schematic view in FIG. 12 wherein a component, represented as an MLCC, can be partially embedded. A composite core, 12, has separate co-facial conductors, 120, thereon with each conductor of the co-facial conductors in electrical contact with one termination, 19, of the capacitor, 18. The co-facial conductors extend beyond the extent of the capacitor footprint allowed for additional electrical attachment to circuit pads, 122, on a circuit board, 124, with the component being received within a void, 126, of the circuit board. The void, depicted schematically, can be a recess of any deviation from the surface of the circuit board up to, and including, a complete removal of material to form a through-hole within which the component resides. A partial recess, which does not extend completely through the circuit board, is preferred. A related embodiment is illustrated in FIG. 13, wherein the co-facial conductors are in electrical contact with jumper conductors, 130, through thru-hole plating, 16. The jumper conductors may be directly mounted to circuit pads with the capacitor above the circuit board or the jumper conductors may be in further electrical contact thru-hole plating, 16, to mounting pads, 132, with the capacitor extending into a void of the circuit board as illustrated in FIG. 12. The configuration illustrated in FIGS. 12 and 13 mitigate any impact of CTE mismatch and may provide additional compliance to mitigate micro-phonics.

Figure 14:
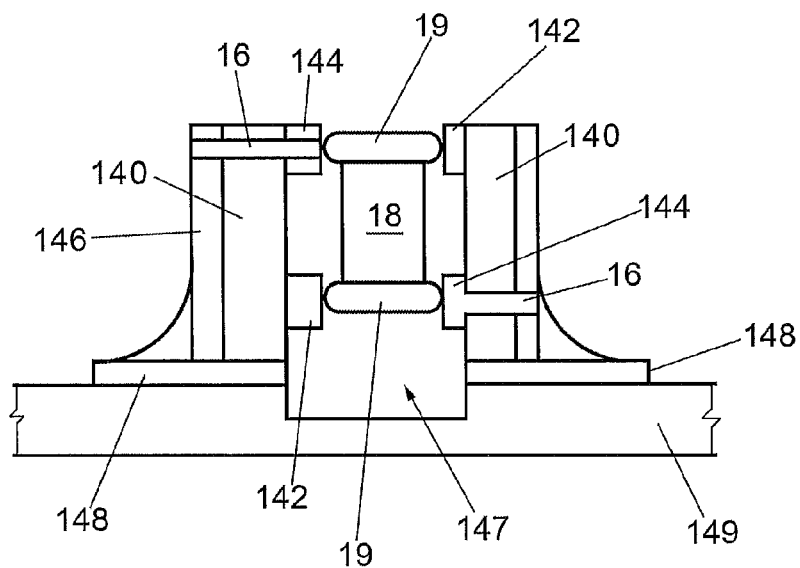
FIG. 14 is a side perspective partial schematic view of an embodiment of the invention.

An embodiment of the invention is illustrated in FIG. 14 in side perspective schematic view. In FIG. 14, an MLCC, 18, is sandwiched between a first C3 and a second C3. The first C3, designated as such for convenience only, comprises a core, 140, with a contact pad, 142, and an active pad, 144. The contact pad is not in electrical contact with further circuitry but provides a point of adhesion for the termination, 19, of the MLCC. The contact pad need not be conductive since the purpose is merely adhesion, however, for manufacturing convenience it is preferable for the contact pad to comprise the same material as the active pad. The active pad is connected to a conductor, 146, on the opposite side of the composite core. The conductor, 146, is then in electrical contact with a circuit trace, 148, on a circuit board, 149. The second C3, which is preferably identical to the first C3, and designated as second for convenience only, is similarly attached to the MLCC except for the active pad and contact pad being switched. A void, 147, in the circuit board below the capacitor is preferred to minimize the possibility of solder under the capacitor.

Figure 15:
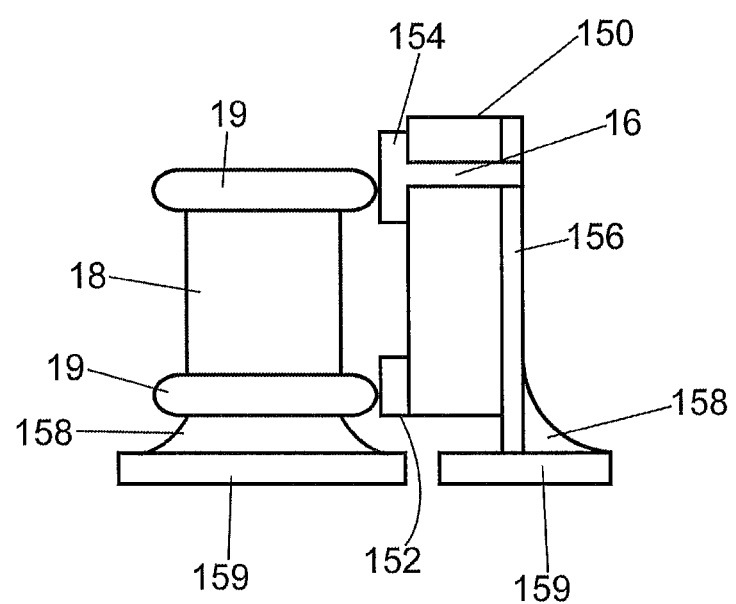
FIG. 15 is a side perspective partial schematic view of an embodiment of the invention.

A embodiment of the invention is illustrated in side perspective schematic view in FIG. 15. An MLCC, 18, with terminations, 19, is attached to a C3 comprising a composite core, 150, with a contact pad, 152, and an active pad, 154, on a common face of the composite core. The active pad is in electrical contact with a conductor, 156, by thru-hole plating, 16. The active pad is in electrical contact with an external termination of the capacitor and the contact pad is in at least physical adhesive contact with the external termination of opposite polarity. The conductor is in electrical contact, preferably by a solder bond, 158, to a trace, 159, and a termination of the capacitor is in electrical contact, preferably also with a solder bond, 158, with a different trace.

The composite core preferable comprises glass fibers and epoxy resins. The composite core material is preferably an epoxy/glass, such as G10 or FR4 but other materials common in the industry may also be consider are known as "Kapton" a Polyimide, CEM 1, 2, 3, 4, and 5 as well as FR-1, 2, 3, 4, and 5. The G10 material used as a C3 core has a CTE of approximately 5.5 compared to BaTiO3 of approximately 10 as shown in Table 1. The epoxy/glass core can be fabricated with preferable thickness of or 0.0254 mm (0.001 inch) up to 1.57 mm (0.062 inches) and more preferably up to 0.787 mm (0.031 inches) and even more preferably up to 0.254 mm (0.010 inches). Higher thicknesses can be considered but will increase the overall size of the stack accordingly, making the stack wider as the C3 thickness increases. The significance of thickness is the mechanical ability of the C3 to absorb greater CTE mismatches.

The conductor is bonded to one or both sides of the composite core. The conductor is electrically conductive material. Though not limited thereto a particularly preferred conductor comprises copper, silver, gold, platinum, palladium or nickel. Copper foil is a particularly preferred conductor. The thickness of the conductor is not particularly limited with ranges typically used in the printed circuit board industry being suitable for demonstration of the invention. A conductor formed of copper with a thickness of 0.009 mm (0.00035 inches) up to 0.14 mm (0.005 inches) is suitable for demonstration of the invention.

The thru-hole plating is accomplished by drilling a hole through the top conductor, through the core, and then thru the bottom conductor. The board is subjected to an electroless copper process where copper is deposited on the side walls of the hole and of the conductors. The board is electroplated with, preferably copper, where an additional thickness of electrodeposited copper is plated to the inside of the hole walls as well as to the surface of the conductors thus making a good electrical connection between the conductors on opposite sides of the composite core. This process is referred to in the art as thru-hole plating. Alternatively, the hole can be filled with a conductive paste or epoxy to create a conductive thru-hole. The choice of material for forming the thru-hole is dependent upon the end use application and the assembly processes involved.

The C3 mitigates the impact of CTE mismatches, board flexure, as well as micro-phonics with minimal additional space requirements. While described herein primarily for use with MLCC's the C3 can be utilized with other passive devices such as inductors, resistors, thermistors and the like.

The method of attaching the conductor to the component or to the circuit board is not limited herein. Solder is commonly employed to create the electrical and mechanical joints, however, other materials or processes that create both electrical and mechanical joints between the various materials without degrading the components is also considered within the scope of this invention. These materials may include conductive resins, epoxies or adhesives, low temperature melting metals and joining processes such as thermo-sonic bonding, thermo-compression bonding, resistance welding, laser welding, just to name a few. Various attachment technologies become obvious to those skilled in the art. The conductive resin provides a compliant interface between the lead frame and the terminations of the MLCC to absorb the CTE mismatches between an aluminum circuit board and the MLCC. As discussed earlier, the C3 component offers the opportunity to be soldered or bonded to a lead frame in a separate process and then attached to the terminations of the MLCC by use of a electrically conductive and cross linking polymer that provides both a mechanical and electrical connection between the C3 and the terminations of the MLCC. It is preferred that the solder or electrically conductive adhesive provide a joint having at least a 2 pound peel strength The C3 design can also be customized to meet the performance requirements of the application. The core of the C3, the foil thickness, the thickness of the solder mask or a combination of these items plus the ability to change the foil and solder mask thickness from side to side can be optimized within a wide degree of design flexibility to meet various application requirements without departing from the instant invention.

Not only is the C3 compliant, it also enables the designer to strategically position the location of the solder joint on the C3 in the area of the lead attach as well as the solder pad on the termination side of the C3 allowing the designer to avoid critical areas of the MLCC's termination that are prone to stress fractures. When the C3 is then assembled and positioned to the terminations and the lead frame aligned to the other side of the C3, sandwiching the C3 between the capacitor and lead frame, the assembly can then be heated to reflow the solder.

Withstanding board flexure is an important design consideration. Board Flexure is generally addressed in the design of the lead. Typically, the industry refers to such design details as stress reliefs. Stress reliefs can be accomplished by selectively reducing the cross section of a lead in a predetermined location, adding a bend or multiple bends in place of having just a straight mechanical member, or increasing the free length of a lead to its attachment point. However when the lead frame is used to secure the stack of multiple MLCC's the free lead length is determined by the distance from the top surface of the substrate or circuit board and the surface of the bottom MLCC. Increasing this distance can be an issue due to the fact that the lead frame is soldered or joined in length to the terminations of the stack.

The C3 mitigates electrostrictive induced micro-phonics. The bulk of the energy in micro-phonics is created in the "Z" axis, perpendicular to the surface of the internal electrodes, of the MLCC, while smaller amounts of energy are released in the "X" axis, parallel to the surface of the internal electrodes of the MLCC. Having the C3 located between the terminations of the MLCC Stack and the lead frame eliminates the direct coupling of the MLCC to the lead frame and by the physical nature of the C3 provides a piezoelectric energy absorbing buffer between the MLCC and the lead frame, thus reducing the amount of piezoelectric energy that gets transferred to the lead frame and eventually into the circuit board which reduces the microphonic noise. The inherent absorption capabilities of the C3 design is unique it provides a solution to 3 design issues, board flexing, CTE compensator, and piezoelectric dampening all within a single design, without requiring complex lead frame designs.

The invention has been described with reference to the preferred embodiments without limit thereto. One of skill in the art would realize additional embodiments and improvements which are within the scope of the invention as more specifically set forth in the claims appended hereto.

The invention claimed is:

1. A discrete electronic device comprising:
    a stack of electronic passive components wherein each electronic passive component of said electronic passive components comprises a first termination and a second termination;
    a first lead frame and a second lead frame;
    a first compensating compliant component wherein said first compensating compliant component comprises:
    a first composite core;
    a first conductor on said first composite core wherein said first conductor is in electrical contact with each said first termination; and
    a second conductor on said first composite core wherein said second conductor is in electrical contact with said first lead frame; and
    a second compensating compliant component wherein said second compensating compliant component comprises:
    a second composite core;
    a third conductor on said second composite core wherein said third conductor is in electrical contact with each said second termination; and
    a fourth conductor on said second composite core wherein said fourth conductor is in electrical contact with said second lead frame.

2. The discrete electronic device of claim 1 wherein said first conductor and said second conductor are on opposite faces of said first first composite core.

3. The discrete electronic device of claim 2 further comprising thru-hole plating electrically connecting said first conductor and said second conductor.

4. The discrete electronic device of claim 2 wherein said first conductor and said second conductor are symmetrical with respect to said first composite core.

5. The discrete electronic device of claim 2 wherein said first conductor and said second conductor are not symmetrical with respect to said first composite core.

6. The discrete electronic device of claim 1 wherein said first conductor and said second conductor are co-facial.

7. The discrete electronic device of claim 6 wherein said second conductor is a contact pad and said first conductor is an active pad.

8. The discrete electronic device of claim 6 further comprising an additional conductor on said first composite core in electrical contact with said first conductor.

9. The discrete electronic device of claim 8 further comprising a second additional conductor on said first composite core in electrical contact with said additional conductor.

10. The discrete electronic device of claim 1 wherein at least one said electronic passive component is selected from a capacitor, a resistor, an inductor, and a thermistor.

11. The discrete electronic device of claim 1 comprising up to 100 stacked electronic passive components.

12. The discrete electronic device of claim 1 further comprising a circuit board.

13. The discrete electronic device of claim 12 wherein said first composite core is parallel to said circuit board.

14. The discrete electronic device of claim 12 wherein said electronic passive component extends into a void of said circuit board.

15. The discrete electronic device of claim 1 wherein at least one of said first conductor or said second conductor comprises at least one of copper, silver, gold, platinum, palladium, nickel.

16. The discrete electronic device of claim 1 wherein said first compensating compliant component further comprises a solder mask.

17. The discrete electronic device of claim 1 wherein said first conductor extends beyond a boundary of said first composite core.

18. The discrete electronic device of claim 17 wherein said first conductor forms a connector for connectivity to a circuit trace.

19. The discrete electronic device of claim 18 wherein said connector for connectivity to a circuit trace is selected from a pin and a foot.

20. The discrete electronic device of claim 1 further comprising a moment arm.

21. The discrete electronic device of claim 20 wherein said second conductor is a partial conductor.

22. The discrete electronic device of claim 1 wherein said first conductor and said second conductor are a continuous conductor.

23. The discrete electronic device of claim 22 wherein said first composite core forms a continuous loop with said continuous conductor on a surface thereof.

24. The discrete electronic device of claim 22 wherein said continuous conductor is on at least two faces of said first composite core.

25. A method of forming a discrete electronic device comprising:
    providing a stack of electronic passive components wherein each electronic passive component of said electronic passive components comprises a first termination and a second termination;

providing a first lead and a second lead;
attaching said first termination of each said electronic passive component to a first conductor of a first compensating compliant component;
attaching said first lead to a second conductor of said first compensating compliant component wherein said first compensating compliant component comprises:
a first composite core with said first conductor and said second conductor on said first composite core;
attaching said second termination of each said electronic passive component to a third conductive of a second compensating compliant component; and
attaching said second lead to a fourth conductor of said second compensating compliant component wherein said second compensating compliant component comprises:
a second composite core with said third conductor and said fourth conductor on said second composite core.

26. The method of forming a discrete electronic device of claim 25 wherein said first conductor and said second conductor are on opposite faces of said first composite core.

27. The method of forming a discrete electronic device of claim 26 further comprising thru-hole plating electrically connecting said first conductor and said second conductor.

28. The method of forming a discrete electronic device of claim 26 wherein said first conductor and said second conductor are symmetrical with respect to said first composite core.

29. The method of forming a discrete electronic device of claim 26 wherein said first conductor and said second conductor are not symmetrical with respect to said first composite core.

30. The method of forming a discrete electronic device of claim 25 wherein said first conductor and said second conductor are co-facial.

31. The method of forming a discrete electronic device of claim 30 wherein said second conductor is a contact pad and said first conductor is an active pad.

32. The method of forming a discrete electronic device of claim 30 further comprising an additional conductor on said first composite core in electrical contact with said first conductor.

33. The method of forming a discrete electronic device of claim 32 further comprising a second additional conductor on said first composite core in electrical contact with said additional conductor.

34. The method of forming a discrete electronic device of claim 25 wherein at least one said electronic passive component is selected from a capacitor, a resistor, an inductor, and a thermistor.

35. The method of forming a discrete electronic device of claim 25 comprising up to 100 stacked electronic passive components.

36. The method of forming a discrete electronic device of claim 25 further comprising attaching said first lead to a circuit board.

37. The method of forming a discrete electronic device of claim 36 wherein said first composite core is parallel to said circuit board.

38. The method of forming a discrete electronic device of claim 36 wherein at least one said electronic passive component extends into a void of said circuit board.

39. The method of forming a discrete electronic device of claim 25 wherein at least one of said first conductor or said second conductor comprises at least one of copper, silver, gold, platinum, palladium, nickel.

40. The method of forming a discrete electronic device of claim 25 wherein said first compensating compliant component further comprises a solder mask.

41. The method of forming a discrete electronic device of claim 25 wherein said first conductor extends beyond a boundary of said first composite core.

42. The method of forming a discrete electronic device of claim 41 wherein said first conductor forms a connector for connectivity to a circuit trace.

43. The method of forming a discrete electronic device of claim 42 wherein said connector for connectivity to a circuit trace is selected from a pin and a foot.

44. The method of forming a discrete electronic device of claim 25 further comprising a moment arm.

45. The method of forming a discrete electronic device of claim 44 wherein said second conductor is a partial conductor.

46. The method of forming a discrete electronic device of claim 25 wherein said first conductor and said second conductor are a continuous conductor.

47. The method of forming a discrete electronic device of claim 46 wherein said first composite core forms a continuous loop with said continuous conductor on a surface thereof.

48. The method of forming a discrete electronic device of claim 46 wherein said continuous conductor is on at least two faces of said first composite core.

49. A discrete electronic device comprising:
a stack of capacitors wherein each capacitor of said capacitors comprises a first termination and a second termination;
a first lead frame and a second lead frame;
a first compensating compliant component comprising:
a first composite core;
a first conductor on said first composite core wherein said first conductor is in electrical contact with said first termination;
a second conductor on said first composite core wherein said second conductor is in electrical contact with said first lead frame;
a second compensating compliant component comprising:
a second composite core;
a third conductor on said second composite core wherein said third conductor is in electrical contact with said second termination; and
a fourth conductor on said second compensating compliant component wherein said fourth conductor is in electrical contact with said second lead frame.

50. The discrete electronic device of claim 49 wherein said first conductor and said second conductor are on opposite faces of said first composite core.

51. The discrete electronic device of claim 50 further comprising thru-hole plating electrically connecting said first conductor and said second conductor.

52. The discrete electronic device of claim 50 wherein said first conductor and said second conductor are symmetrical with respect to said first composite core.

53. The discrete electronic device of claim 50 wherein said first conductor and said second conductor are not symmetrical with respect to said first composite core.

54. The discrete electronic device of claim 49 wherein said first conductor and said second conductor are co-facial.

55. The discrete electronic device of claim 54 wherein said second conductor is a contact pad and said first conductor is an active pad.

56. The discrete electronic device of claim 54 further comprising and additional conductor on said first composite core in electrical contact with said first conductor.

57. The discrete electronic device of claim 56 further comprising a second additional conductor on said first composite core in electrical contact with said additional conductor.

58. The discrete electronic device of claim 49 wherein at least one said capacitor is a multi-layered ceramic capacitor.

59. The discrete electronic device of claim 49 comprising up to 100 stacked capacitors.

60. The discrete electronic device of claim 49 further comprising a circuit board.

61. The discrete electronic device of claim 60 wherein said first composite core is parallel to said circuit board.

62. The discrete electronic device of claim 60 wherein at least one said capacitor extends into a void of said circuit board.

63. The discrete electronic device of claim 49 wherein at least one of said first conductor or said second conductor comprises at least one of copper, silver, gold, platinum, palladium, nickel.

64. The discrete electronic device of claim 49 wherein said first compensating compliant component further comprises a solder mask.

65. The discrete electronic device of claim 49 wherein said first conductor extends beyond a boundary of said first composite core.

66. The discrete electronic device of claim 65 wherein said first conductor forms a connector for connectivity to a circuit trace.

67. The discrete electronic device of claim 66 wherein said connector for connectivity to a circuit trace is selected from a pin and a foot.

68. The discrete electronic device of claim 49 further comprising a moment arm.

69. The discrete electronic device of claim 68 wherein said second conductor is a partial conductor.

70. The discrete electronic device of claim 49 wherein said first conductor and said second conductor are a continuous conductor.

71. The discrete electronic device of claim 70 wherein said first composite core forms a continuous loop with said continuous conductor on a surface thereof.

72. The discrete electronic device of claim 70 wherein said continuous conductor is on at least two faces of said first composite core.

* * * * *